(12) United States Patent
  Hokari

(10) Patent No.: US 9,462,733 B2
(45) Date of Patent: Oct. 4, 2016

(54) MAGNETIC SHIELDING APPARATUS AND MAGNETIC SHIELDING METHOD

(71) Applicant: Seiko Epson Corporation, Tokyo (JP)

(72) Inventor: Ryuji Hokari, Ota (JP)

(73) Assignee: Seiko Epson Corporation (JP)

( * ) Notice: Subject to any disclaimer, the term of this patent is extended or adjusted under 35 U.S.C. 154(b) by 93 days.

(21) Appl. No.: 14/482,358

(22) Filed: Sep. 10, 2014

(65) Prior Publication Data

US 2015/0069846 A1    Mar. 12, 2015

(30) Foreign Application Priority Data

Sep. 11, 2013  (JP) ................................. 2013-188097
Jun. 20, 2014  (JP) ................................. 2014-127008

(51) Int. Cl.
  *H01F 27/42*    (2006.01)
  *H05K 9/00*     (2006.01)
  *G01R 1/18*     (2006.01)
  *G01R 33/00*    (2006.01)
  *G01R 33/025*   (2006.01)

(52) U.S. Cl.
  CPC ............... *H05K 9/0071* (2013.01); *G01R 1/18* (2013.01); *G01R 33/0076* (2013.01); *G01R 33/025* (2013.01)

(58) Field of Classification Search
  CPC ............ H05K 9/0071; G01R 33/0076; G01R 33/022; G01R 33/025
  See application file for complete search history.

(56) References Cited

U.S. PATENT DOCUMENTS

| 5,187,327 | A | * | 2/1993 | Ohta | ..................... H05K 9/0077 |
| | | | | | 174/15.4 |
| 7,193,413 | B2 | | 3/2007 | Kandori et al. | |
| 2014/0077612 | A1 | | 3/2014 | Onuma et al. | |

FOREIGN PATENT DOCUMENTS

| JP | 06-167583 | | 6/1994 |
| JP | 2002-094280 A | | 3/2002 |
| JP | 2002-257914 A | | 9/2002 |
| JP | 2003-167038 A | | 6/2003 |
| JP | 2003167038 A | * | 6/2003 |
| JP | 2003-243874 A | | 8/2003 |
| JP | 2003-273565 A | | 9/2003 |
| JP | 2005-016960 A | | 1/2005 |
| JP | 2005-294537 A | | 10/2005 |
| JP | 2007-129049 A | | 5/2007 |
| JP | 2008-282983 A | | 11/2008 |
| JP | 2009-175067 A | | 8/2009 |
| JP | 2009-229325 A | | 10/2009 |
| JP | 4377566 B2 | | 12/2009 |
| JP | 2010-093242 A | | 4/2010 |
| JP | 2011-082444 A | | 4/2011 |
| JP | 2014-060270 A | | 4/2014 |

* cited by examiner

*Primary Examiner* — Daniel Cavallari
(74) *Attorney, Agent, or Firm* — Harness, Dickey & Pierce, P.L.C,

(57) ABSTRACT

A magnetic shielding apparatus includes: a passive shield; a correction target space that is defined in the interior of the passive shield; external coils as a first coil that corrects a magnetic field in the passive shield; a first magnetic sensor; a second magnetic sensor that is arranged more inside the passive shield than the first magnetic sensor; and a control unit. The first magnetic sensor and the second magnetic sensor measure a magnetic field gradient in the passive shield. The control unit controls the external coils based on a result of the measurement performed by the first magnetic sensor and the second magnetic sensor.

8 Claims, 6 Drawing Sheets

MAGNETIC SHIELDING APPARATUS AND MAGNETIC SHIELDING METHOD

This application claims the benefit of Japanese Patent Application No. 2013-188097, filed on Sep. 11, 2013, and Japanese Patent Application No. 2014-127008, filed on Jun. 20, 2014. The contents of the aforementioned applications are incorporated herein by reference in their entirety.

BACKGROUND

1. Technical Field

The present invention relates to a magnetic shielding apparatus and a magnetic shielding method.

2. Related Art

Diagnostic imaging is widely used in medical practice. The diagnostic imaging, which is non-invasive and therefore puts less burden on the human body, is preferably used especially in examining organs important for the vital activities, such as the heart or brain.

The organs of a living body always generate weak currents due to the activities of neurons. By measuring magnetic fields caused by the currents, the condition of the organ can be known.

Specifically, the magnetic field arising from the living body is extremely weak such as from about 0.1 picotesla ($1 \times 10^{-13}$ T) to about 10 picotesla ($1 \times 10^{-11}$ T).

One of methods to detect and image such a magnetic field is magnetic source imaging. For example, a method of recording magnetic fields formed by the activities of the heart is known as magnetocardiography (MCG). Moreover, a method of measuring and recording magnetic fields formed by the activities of the brain is known as magnetoencephalography (MEG).

On the other hand, an external magnetic field such as terrestrial magnetism is, for example, from about 10 microtesla ($1 \times 10^{-5}$ T) to about 100 microtesla ($1 \times 10^{-4}$ T), and has a size of 100,000 times or greater compared to the magnetic field generated from the brain or heart. Therefore, such an external magnetic field becomes noise in highly sensitive magnetic field measurement.

That is, for detecting a weak magnetic field from a living body, an external magnetic field serving as noise needs to be blocked in addition to the use of a highly sensitive magnetic field measuring device. For blocking the external magnetic field, a magnetic shielding apparatus needs to be used. Then, as the magnetic shielding apparatus to block the external magnetic field, techniques have been known as disclosed in, for example, JP-A-6-167583, JP-A-2002-94280, JP-A-2002-257914, JP-A-2005-294537, JP-A-2007-129049, JP-A-2008-282983, JP-A-2009-175067, and Japanese Patent No. 4377566 (Patent Document 1 to Patent Document 8).

According to the techniques disclosed in Patent Document 1 to Patent Document 8, a canceling magnetic field is generated so as to minimize the magnetic field of a space (space where a magnetic field measuring device is arranged) as a control object in the interior of the magnetic shielding apparatus, or a canceling magnetic field is generated so as to minimize an inflowing magnetic field into an opening or the like of the magnetic shielding apparatus.

However, in the techniques disclosed in Patent Document 1 to Patent Document 8, there is a problem that it is difficult to create an environment where a magnetic field gradient is extremely gentle in the interior of a magnetic shield. Specifically, a magnetic field from the outside can be reduced in the related art; however, there is a problem that a gradient is generated in the magnetic field state of the interior of the magnetic shield because a magnetization component or the like of the magnetic shield is not considered.

SUMMARY

An advantage of some aspects of the invention is to solve at least a part of the problems described above, and the invention can be implemented as the following forms or application examples.

APPLICATION EXAMPLE 1

A magnetic shielding apparatus according to this application example includes: a passive shield; a correction target space that is defined in the interior of the passive shield; a first coil that corrects a magnetic field in the passive shield; a first magnetic sensor; a second magnetic sensor that is arranged more inside the passive shield than the first magnetic sensor; and a control unit, wherein the first magnetic sensor and the second magnetic sensor measure a magnetic field gradient in the passive shield, and the control unit controls the first coil based on a result of the measurement performed by the first magnetic sensor and the second magnetic sensor.

According to this configuration, the first magnetic sensor and the second magnetic sensor measure respective magnetic field strengths to measure the magnetic field gradient in the interior of the passive shield. Based on the measured value of the magnetic field gradient, the control unit estimates the maximum magnetic field gradient in the correction target space. Further, the control unit adjusts the amount of current of the first coil so that the maximum magnetic field gradient in the correction target space is equal to or less than a predetermined threshold value. By making the magnetic field gradient in the correction target space equal to or less than the predetermined threshold value, a space to perform magnetic field measurement in a state where the magnetic field gradient is extremely gentle can be provided in the correction target space.

APPLICATION EXAMPLE 2

In the magnetic shielding apparatus according to the application example, it is preferable that the control unit controls the first coil so that the magnetic field gradient is equal to or less than a threshold value.

According to this configuration, by making the magnetic field gradient equal to or less than the predetermined threshold value, the magnetic field gradient can be made equal to or less than the predetermined threshold value also in the correction target space that is located more inside the passive shield than the first magnetic sensor.

That is, the space to perform magnetic field measurement in the state where the magnetic field gradient is extremely gentle can be provided in the correction target space.

APPLICATION EXAMPLE 3

In the magnetic shielding apparatus according to the application example, it is preferable that the first magnetic sensor and the second magnetic sensor measure a magnetic field gradient along a first direction, and that an axis of the first coil is along the first direction.

According to this configuration, the direction of the magnetic field gradient measured by the first magnetic sensor and the second magnetic sensor is the same as the axial direction of the first coil. Accordingly, by controlling the amount of current of the first coil, the adjustment of the magnetic field gradient can be easily performed.

APPLICATION EXAMPLE 4

In the magnetic shielding apparatus according to the application example, it is preferable that the passive shield includes an opening, and that when a coordinate of the opening with respect to the first direction is the origin and a direction from the opening toward the interior of the passive shield along the first direction is a positive direction of the first direction, the first magnetic sensor is arranged, with respect to the first direction, in a range from −0.5 times to 1.0 times the square root of the area of a projected cross-section of the opening orthogonal to the first direction.

According to this configuration, flexibility in the arrangement of the first magnetic sensor is increased, and further, the magnetic field gradient can be made equal to or less than the predetermined threshold value also in the correction target space of the passive shield having the opening.

APPLICATION EXAMPLE 5

In the magnetic shielding apparatus according to the application example, it is preferable that the second magnetic sensor is arranged, with respect to the first direction, in a range from 0 times to 1.0 times the square root of the area of a projected cross-section of the opening orthogonal to the first direction, and that a coordinate of the second magnetic sensor with respect to the first direction is more positive than a coordinate of the first magnetic sensor with respect to the first direction.

According to this configuration, flexibility in the arrangement of the second magnetic sensor is increased, and further, the magnetic field gradient can be made equal to or less than the predetermined threshold value also in the correction target space of the passive shield having the opening.

APPLICATION EXAMPLE 6

In the magnetic shielding apparatus according to the application example, it is preferable that a coordinate of the correction target space with respect to the first direction is more positive than a coordinate of the first magnetic sensor with respect to the first direction.

According to this configuration, the magnetic field gradient can be made equal to or less than the predetermined threshold value also in the correction target space of the passive shield.

APPLICATION EXAMPLE 7

In the magnetic shielding apparatus according to the application example, it is preferable that the magnetic shielding apparatus further includes, in the interior of the passive shield, a second coil that adjusts a magnetic field strength of the correction target space.

According to this configuration, by adjusting the amount of current of the second coil, the magnetic field strength of the correction target space can be adjusted to be a predetermined value. That is, a space to perform magnetic field measurement in a state where the magnetic field strength is weaker can be provided in the correction target space.

APPLICATION EXAMPLE 8

A magnetic shielding method according to this application example includes: measuring a magnetic field gradient in a passive shield; making the magnetic field gradient equal to or less than a predetermined threshold value based on the measuring of the magnetic field gradient; measuring a magnetic field strength in the passive shield; and making the magnetic field strength equal to or less than a predetermined threshold value.

According to this method, the magnetic field gradient can be made equal to or less than the predetermined threshold value in the correction target space of the passive shield. Moreover, the magnetic field strength of the correction target space can be adjusted to be the predetermined value. That is, the correction target space can be made into a magnetic field measurement space to perform magnetic field measurement in a state where the magnetic field gradient is extremely gentle.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, an embodiment in which the invention is embodied will be described using the drawings. The drawings to be used are displayed by appropriately enlarging or reducing them so that portions to be described can be clearly recognized to facilitate the understanding of readers.

Embodiment

Figure 1:
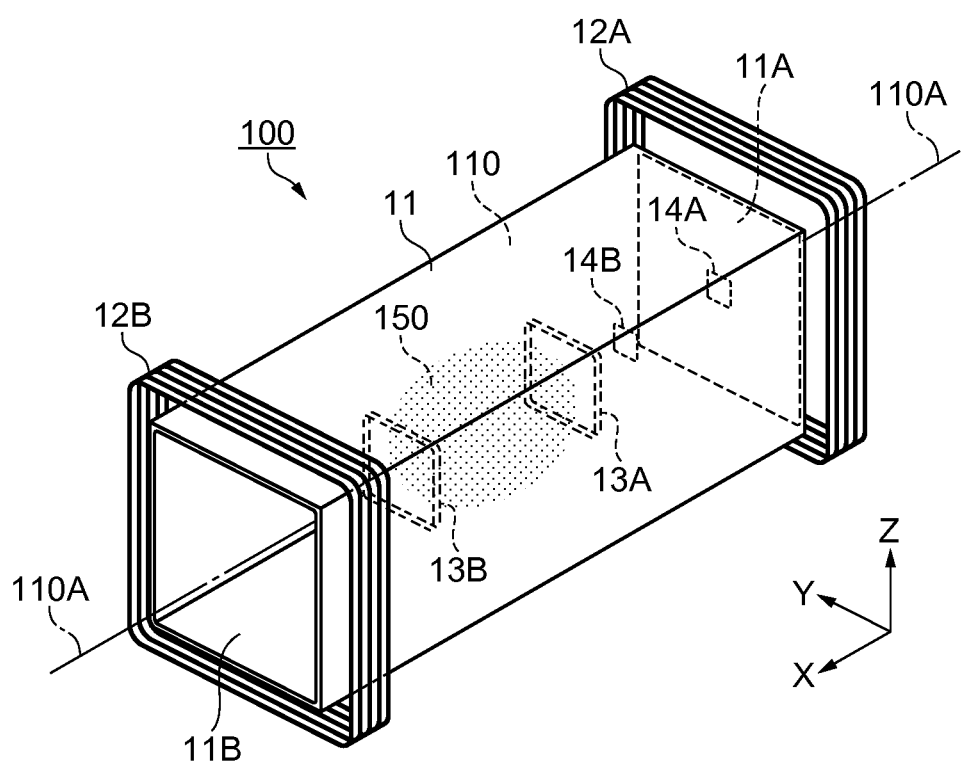
FIG. 1 is a perspective overview of a magnetic shielding apparatus.

FIG. 1 is a perspective overview of a magnetic shielding apparatus 100 according to the embodiment. The magnetic shielding apparatus 100 is used to shield a magnetic measuring device from an external magnetic field such as terrestrial magnetism when, for example, measuring a weak current generated from a living body as magnetism.

Figure 2:
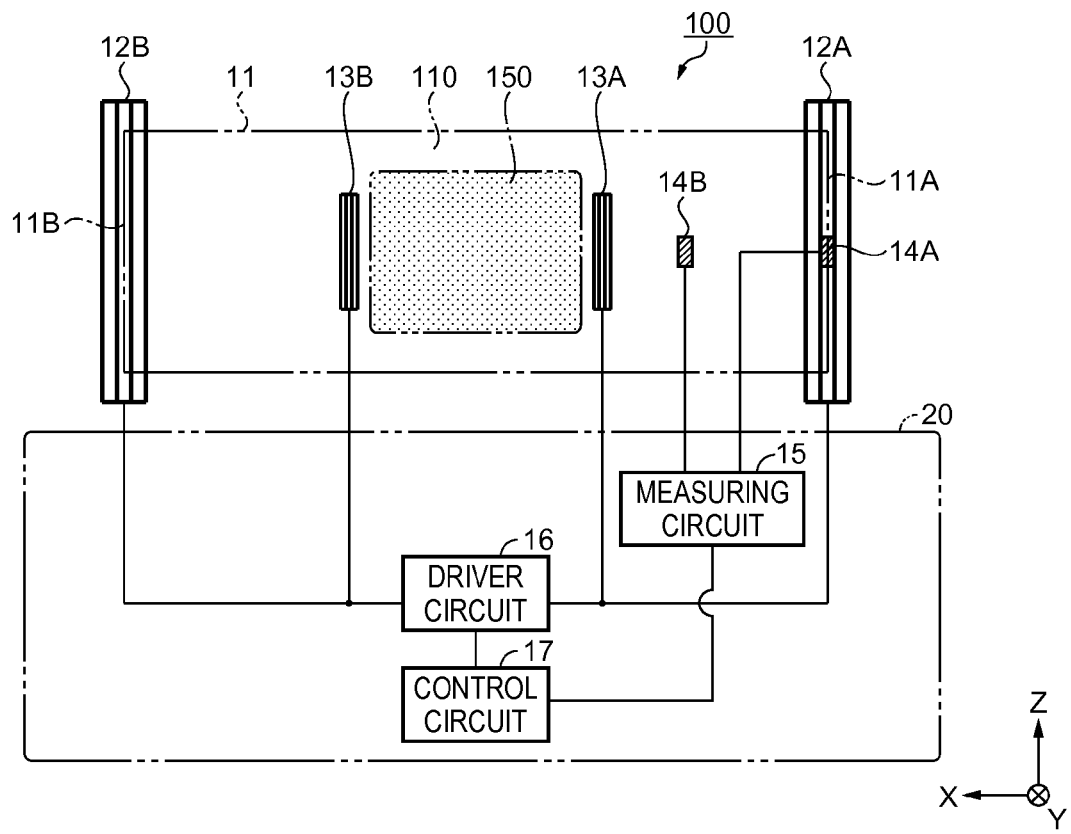
FIG. 2 is an overview of the magnetic shielding apparatus, including a control unit.

The magnetic shielding apparatus 100 includes a passive shield 11, external coils 12A and 12B that correct an internal magnetic field of the passive shield 11, a first magnetic sensor 14A, a second magnetic sensor 14B, internal coils 13A and 13B that are arranged in the interior of the passive shield 11, and a control unit 20 (refer to FIG. 2). The external coils 12A and 12B are an example of a "first coil" according to the invention, and the internal coils 13A and 13B are an example of a "second coil" according to the invention.

The passive shield 11 has a cylindrical shape with a cavity therein, and is arranged on, for example, a base (not shown) with the axial direction thereof substantially horizontal. A cross-sectional shape of the passive shield 11 in the axial direction is substantially quadrilateral. The passive shield 11 is opened at both ends in the axial direction, an opening 11A at one end and an opening 11B at the other end. The size of the passive shield 11 is set such that the length in the axial direction is about 200 cm and one side of each of the openings 11A and 11B is about 90 cm. The passive shield 11 having such a size allows "the human body" as an object to be measured to move in and out through either the opening 11A or 11B and lie therein.

The passive shield 11 is formed of a ferromagnetic substance (permalloy, ferrite, or amorphous iron, chromium, or cobalt, or the like) having a relative permeability of, for example, several thousands or more, or a conductor having high conductivity (a conductor providing a magnetic field-reducing effect due to an eddy current effect is desirable, for example, aluminum or the like). It is also possible to form the passive shield 11 by alternatively stacking the ferromagnetic substance and the conductor having high conductivity described above. In the embodiment, two layers of aluminum and two layers of permalloy are alternatively formed to have a total thickness of about 20 to 30 mm.

An area surrounded by the passive shield 11 is defined as an interior space 110, while an area other than the interior space 110 (outside the passive shield 11) is defined as an exterior space. The interior space 110 has such a space that can accommodate an object to be measured (for example, the human body) or a highly sensitive magnetic sensor (for example, an optical pumping magnetic sensor) (not shown) that measures a magnetic field generated by the object to be measured. In the interior space 110, an area where a highly sensitive magnetic sensor is arranged to measure a weak magnetic signal from, for example, the heart or brain is especially referred to as a correction target space 150. A more detailed description will be given later.

In the following description, a three-dimensional orthogonal coordinate system is used for facilitating the understanding of the embodiment. The axial direction of the passive shield 11 is defined as an X-direction, the depth direction is defined as a Y-direction, and the so-called height direction orthogonal to the X-direction and the Y-direction is defined as a Z-direction. A line connecting the centers of vertical sections (YZ-plane) of the passive shield 11 at portions in the axial direction, and an extending line of the line are hereinafter defined as a central axis 110A. In the case of a substantially cylindrical shape like the passive shield 11 of the embodiment, a line connecting the central point of the opening 11A with the central point of the opening 11B is the central axis 110A.

Moreover, the position of the opening 11A is defined as the origin in the X-direction, and a direction from the opening 11A toward the opening 11B is defined as a positive X-direction. The X-direction is an example of a "first direction" according to the invention. For example, when the opening 11A is not a vertical section relative to the central axis 110A, that is, when the opening 11A is inclined to the central axis 110A, the farthest position in the positive X-direction on a ridge line surrounding the opening 11A is defined as the origin in the X-direction. That is, a position in the X-direction at which the same shape as a projected plan view of the passive shield 11 on the YZ-plane appears as a cross-sectional shape is referred to as the origin.

The external coils 12A and 12B are coils for correcting an inflowing magnetic field into the interior space 110. When an external magnetic field enters from the openings 11A and 11B into the interior space 110, the magnetic field is the inflowing magnetic field. The inflowing magnetic field is strongest in a direction vertical to vertical sections of the openings 11A and 11B (that is, a direction along the first direction). The external coils 12A and 12B are, for example, a Helmholtz coil, and generate a magnetic field with a current supplied from a power supply (not shown).

The external coil 12A, which is arranged on the opening 11A side, and the external coil 12B, which is arranged on the opening 11B side as the remaining end, are arranged so as to surround the passive shield 11. In the embodiment, the diameter of the external coils 12A and 12B is about 120 cm. It is desirable that the external coil 12A is arranged at substantially the same position as that of the opening 11A in the X-direction, that is, at the position of the origin in the X-direction. It is desirable that the external coil 12B is arranged at substantially the same position as that of the opening 11B in the X-direction.

The external coils 12A and 12B are arranged in a positional relation in which a direction of an axis passing through the respective centers thereof is substantially the same as that of the central axis 110A of the passive shield 11. As a result of this, since the direction in which the inflowing magnetic field is strong substantially coincides with a direction of a magnetic field that the external coils 12A and 12B correct, a magnetic field gradient can be efficiently corrected. The external coils 12A and 12B may be configured such that the passive shield 11 is surrounded by a non-magnetized frame (not shown) and the coils are arranged so as to wind around the frame portion. Moreover, the shape of the external coils 12A and 12B does not have to be the shape similar to the cross-sectional shape of the passive shield 11 in the direction of the central axis 110A, and therefore may be, for example, circular.

The first magnetic sensor 14A is, for example, a semiconductor sensor that measures an inflowing magnetic field from the exterior space into the interior space 110. The first magnetic sensor 14A is provided on the central axis 110A, and arranged at substantially the same position as that of the opening 11A in the X-direction.

Te second magnetic sensor 14B is, for example, a semiconductor sensor for measuring a magnetic field strength in a certain area of the interior space 110. The second magnetic sensor 14B is provided on the central axis 110A as in the same manner as the first magnetic sensor 14A. The size of both the first magnetic sensor 14A and the second magnetic sensor 14B is about a square of 2 cm each side, and they are arranged each with a non-magnetized jig (not shown) in the interior of the passive shield 11.

The second magnetic sensor 14B is located inside the passive shield 11 relative to the first magnetic sensor 14A. In other words, the second magnetic sensor 14B is located in the positive X-direction relative to the first magnetic sensor 14A. By measuring magnetic field strengths with the first magnetic sensor 14A and the second magnetic sensor 14B, a magnetic field gradient along the axial direction of the central axis 110A can be measured. In the following description, the magnetic field gradient obtained by the first magnetic sensor 14A and the second magnetic sensor 14B is referred to as an inflowing magnetic field gradient.

In summary, the first magnetic sensor 14A and the second magnetic sensor 14B are provided on the central axis 110A. Moreover, since the axis passing through the respective centers of the external coils 12A and 12B is also arranged so as to have the same direction as that of the central axis 110A, the direction of the inflowing magnetic field gradient is the same as that of a magnetic field that the external coils 12A and 12B can correct.

The internal coils 13A and 13B are coils used to adjust the magnetic field strength of the correction target space 150, and arranged in the interior space 110 so as to interpose both ends of the correction target space 150 therebetween. It is desirable that the internal coils 13A and 13B are arranged so that an axis passing through the respective centers of the coils overlaps the central axis 110A of the passive shield 11.

The internal coils 13A and 13B are, for example, a Helmholtz coil, and generate a uniform magnetic field with a current supplied from a power supply (not shown) and flowing into the coils. Since the internal coils 13A and 13B are the Helmholtz coil, a uniform magnetic field strength can be formed on at least the axis connecting the respective centers of the internal coils 13A and 13B in the correction target space 150. That is, by adjusting the amount of current flowing into the internal coil 13A and the internal coil 13B, the magnetic field strength of the correction target space 150 can be offset adjusted to be any value.

Since the position of the correction target space 150 cannot be definitely defined by its nature, a space interposed between the internal coil 13A and the internal coil 13B is defined as the correction target space 150 (dot-hatched areas in FIGS. 1 and 2) in the passive shield 11 including the internal coils 13A and 13B. The correction target space 150 is located in the more positive X-direction than the first magnetic sensor 14A.

As has been described above, the external coils 12A and 12B, the internal coils 13A and 13B, the first magnetic sensor 14A, and the second magnetic sensor 14B are arranged so as to be along the central axis 110A of the passive shield 11 in the embodiment.

An outline of the magnetic shielding apparatus 100 has been described. Then, an object of the embodiment will be more clearly described. Earnest studies by the present inventor have revealed that it is important, for highly sensitively measuring, for example, a weak magnetic field less than one hundred thousandth the external magnetic field such as a magnetic field from a living body, that a magnetic field gradient in the correction target space 150 serving as an area to measure the magnetic field is equal to or less than a certain threshold value.

That is, in the related art as disclosed in Patent Document 1 to Patent Document 8, a canceling magnetic field is generated so as to minimize the magnetic field in the correction target space 150, or a canceling magnetic field is generated so as to minimize the inflowing magnetic field from the opening 11A (11B) of the magnetic shielding apparatus 100. When doing so, a difference between, for example, an end of the correction target space 150 and the opening 11A appears as a magnetic field gradient in the correction target space 150. The present inventor has found that the magnetic field gradient in the correction target space 150 inhibits highly sensitive magnetic field measurement. Therefore, for highly sensitively measuring the weak magnetic field described above, it is first important to control the magnetic field gradient in the correction target space 150 to be equal to or less than a certain threshold value. After controlling the magnetic field gradient in the correction target space 150 to be equal to or less than the certain threshold value, it is important to minimize the magnetic field strength in the correction target space 150 according to an object to be measured. The threshold value will be described later.

The present inventor has confirmed through experiments that the magnetic field gradient in the correction target space 150 can be estimated from the inflowing magnetic field gradient. That is, it has been confirmed that by making the inflowing magnetic field gradient equal to or less than a certain threshold value, the magnetic field gradient in the correction target space 150 can also be made equal to or less than a predetermined threshold value.

For the avoidance of doubt, the inflowing magnetic field gradient and the magnetic field gradient in the correction target space 150 are numerically different from each other. This is because since the inflowing magnetic field gradient is a magnetic field gradient in the vicinity of the opening 11A, the inflowing magnetic field gradient is usually greater than the magnetic field gradient in the correction target space 150 due to influence of a leakage magnetic field or the like from the passive shield 11.

A relative positional relation in the X-direction between the first magnetic sensor 14A and the second magnetic sensor 14B, which is important for estimating the magnetic field gradient in the correction target space 150, will be described in more detail. According to the experiments by the present inventor, it has been confirmed that by arranging the first magnetic sensor 14A and the second magnetic sensor 14B at positions having the following relationship, the inflowing magnetic field gradient can be preferably measured or estimated. The preferable measurement or estimation herein means measurement with which the magnetic field gradient in the correction target space 150 (specifically, a magnetic field gradient between the internal coil 13A and the internal coil 13B) can be estimated based on the inflowing magnetic field gradient.

For showing areas where the first magnetic sensor 14A and the second magnetic sensor 14B can be arranged, a cross-sectional area of the opening 11A is referred to as S. The cross-sectional area S of the opening 11A in this case is defined as the area of a projected cross-section on the YZ-plane relative to the X-direction. When the central position of the opening 11A is the origin in the X-direction and the direction from the opening 11A toward the opening 11B is the positive X-direction (+X-direction) as described above, it is preferable that the position of the first magnetic sensor 14A is located in a range from the origin, relative to the +X-direction, to less than 1.0 times (+√S) the square root of the area (S) of the projected cross-section of the opening 11A on the YZ-plane and in a range from the origin, relative to the −X-direction, to 0.5 times (0.5×√S) the square root of the area (S) of the projected cross-section on the YZ-plane in absolute value. That is, when a range (X coordinate) where the first magnetic sensor 14A can be arranged is L1, L1 corresponds to a range expressed by Formula (1). In the embodiment, the position of L1 is 0 cm.

$$-0.5 \times \sqrt{S} \leq L1 < +\sqrt{S} \tag{1}$$

Moreover, it is preferable that the position of the second magnetic sensor 14B is located in a range from the position of the origin, relative to the +X-direction, to 1.0 times (+√S) the square root of the area (S) of the projected cross-section on the YZ-plane. That is, when a range where the second magnetic sensor 14B can be arranged is L2, L2 corresponds to a range expressed by Formula (2). However, the position of the second magnetic sensor 14B in the +X-direction has to be always located at a position more positive than the first magnetic sensor 14A. In the embodiment, the position of L2 is about 60 cm.

$$0 < L2 \leq +\sqrt{S} \tag{2}$$

FIG. 2 shows an overview of the magnetic shielding apparatus 100 according to the embodiment, including the control unit. In FIG. 2, the control unit 20 is shown in addition to a schematic cross-sectional view of the magnetic shielding apparatus 100 in FIG. 1 as viewed from the Y-axis direction. In the following description, the description of portions overlapping those of FIG. 1 is omitted.

Although the control unit 20 includes a measuring circuit 15, a driver circuit 16, and a control circuit 17 in FIG. 2, the control unit 20 does not have to have this configuration. That is, the control unit 20 may include at least one of the circuits, or may include another circuit. Moreover, although the X-, Y-, Z-directions are shown in FIG. 2, these directions are not considered when representing the positional relations among the measuring circuit 15 and the like constituting the control unit 20.

The measuring circuit 15 is connected to each of the first magnetic sensor 14A, the second magnetic sensor 14B, and a highly sensitive magnetic sensor (not shown) located in the correction target space 150. The highly sensitive magnetic sensor as used herein means a magnetic sensor having measurement accuracy equal to or higher than the first magnetic sensor 14A and the second magnetic sensor 14B. Although a plurality of sensors such as the first magnetic sensor 14A and the second magnetic sensor 14B are connected to one measuring circuit 15 in FIG. 2, the measuring circuit 15 may be provided independently in each magnetic sensor.

With the measuring circuit 15, a magnetic field strength at each of the first magnetic sensor 14A and the second magnetic sensor 14B, or a distance from the position of the origin, for example, can be measured.

The driver circuit 16 is connected to each of the external coils 12A and 12B and the internal coils 13A and 13B. Although four coils, the external coils 12A and 12B and the internal coils 13A and 13B, are connected to one driver circuit 16 in FIG. 2, the driver circuit 16 may be provided independently in each coil. The driver circuit 16 supplies alternating current and direct current to the coils from a power supply (not shown) and causes the coils to generate magnetic fields.

The control circuit 17 is connected to the measuring circuit 15 and the driver circuit 16. The control circuit 17 is a device that calculates an inflowing magnetic field gradient according to the magnetic field strengths measured by the measuring circuit 15 and controls the driver circuit 16 so that the inflowing magnetic field gradient is equal to or less than a predetermined threshold value.

Figure 3:
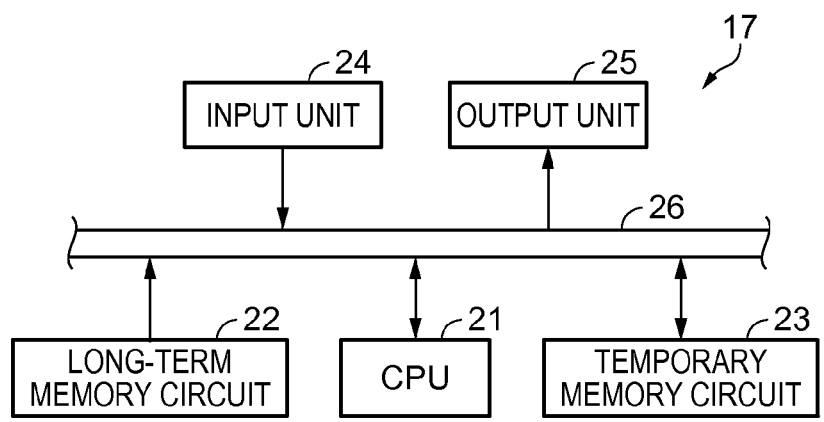
FIG. 3 is a diagram showing an example of the configuration of a control circuit.

FIG. 3 is a diagram showing an example of the configuration of the control circuit 17. The control circuit 17 includes a CPU (Central Processing Unit) 21, a long-term memory circuit (for example, a nonvolatile memory such as a ROM (Read Only Memory) or a flash memory) 22, a temporary memory circuit (for example, a RAM (Random Access Memory) such as a DRAM or an SRAM) 23, an input unit 24, and an output unit 25. The components are electrically connected to each other via a bus 26.

The CPU 21 reads and executes control programs stored in the long-term memory circuit 22 to control the driver circuit 16 based on the magnetic field strengths acquired from the measuring circuit 15. By way of example, the long-term memory circuit 22 holds the threshold value of the inflowing magnetic field gradient and the like. The temporary memory circuit 23 provides a working area when the CPU 21 executes control programs. The input unit 24 receives the magnetic field strengths and the like from the measuring circuit 15 via an operating unit (not shown). The output unit 25 outputs a drive signal (for example, the magnitude of alternating current or the like) to the driver circuit 16. That is, the CPU 21 can send an optimum instruction to the driver circuit 16 so that the inflowing magnetic field gradient calculated based on the magnetic field strengths measured by the first magnetic sensor 14A, the second magnetic sensor 14B, and the measuring circuit 15 is equal to or less than the threshold value.

Operating Method of Magnetic Shielding Apparatus 100

Figure 4:
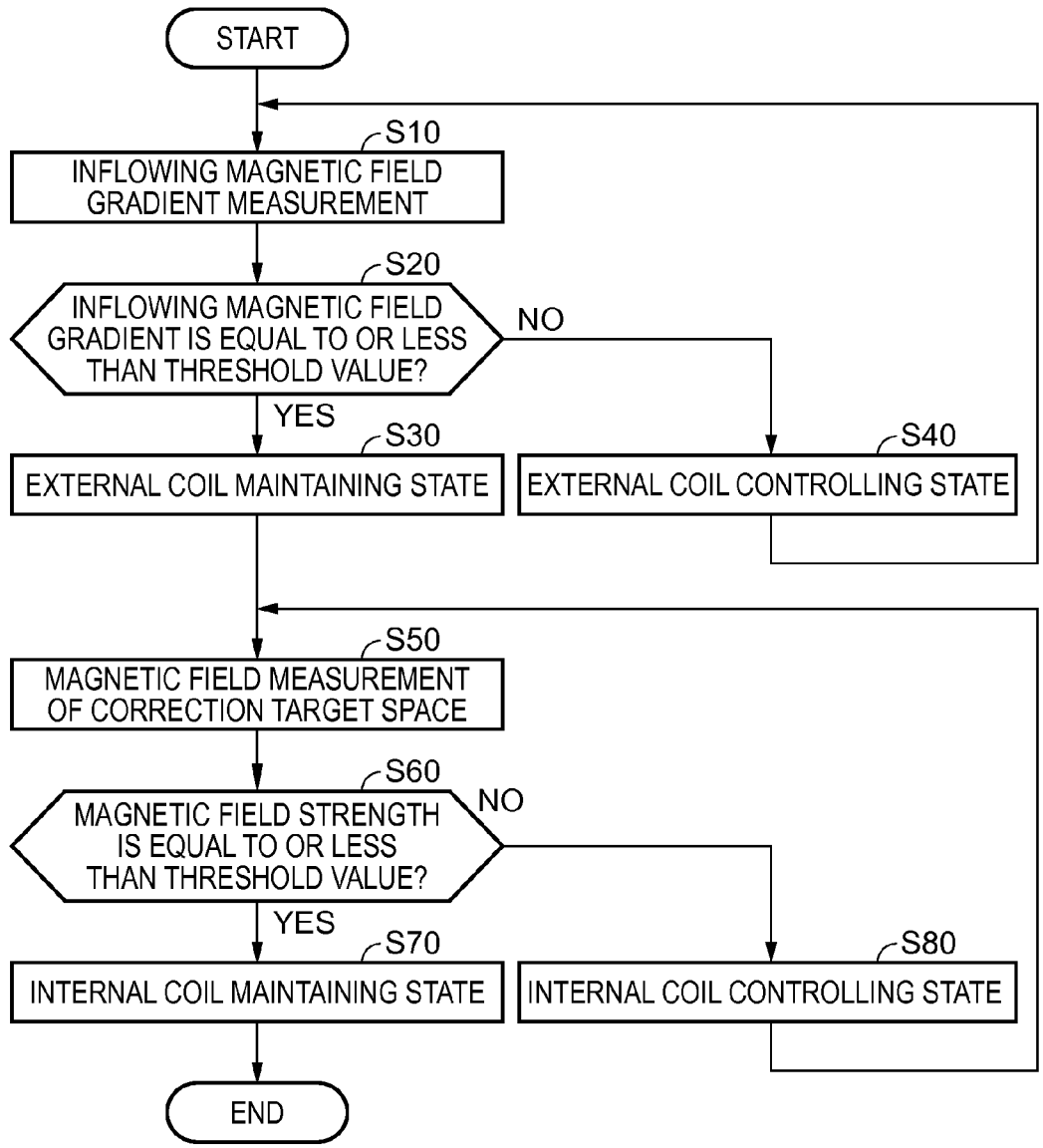
FIG. 4 is an operation flowchart of the magnetic shielding apparatus.

Next, the operation of the magnetic shielding apparatus 100 will be described using FIG. 4. FIG. 4 is an operation flowchart of the magnetic shielding apparatus 100. Processing in FIG. 4 starts, for example, as a result of driving the magnetic shielding apparatus 100. That is, it is a state where the external coils 12A and 12B or the internal coils 13A and 13B are operated by the driver circuit 16 based on the performance (shown by, for example, "high permeability× thickness") or the like of the passive shield 11.

Inflowing Magnetic Field Gradient Measurement (S10)

A measuring method of an inflowing magnetic field gradient will be described. The inflowing magnetic field gradient as used in Step S10 is one obtained by dividing a difference between the magnetic field strengths measured by the first magnetic sensor 14A and the second magnetic sensor 14B as described above by a distance between the first magnetic sensor 14A and the second magnetic sensor 14B.

First, a magnetic field strength (the inflowing magnetic field from the exterior space into the interior space 110) at a position where the first magnetic sensor 14A is installed, and a distance from the origin are measured by the first magnetic sensor 14A and the measuring circuit 15 (in the embodiment, the distance from the origin is zero because the first magnetic sensor 14A is arranged at the origin). Subsequently, a magnetic field strength (the magnetic field strength of the interior space 110) at a position where the second magnetic sensor 14B is installed, and a distance from the origin are measured by the second magnetic sensor 14B and the measuring circuit 15.

The control circuit 17 acquires the magnetic field strengths at the first magnetic sensor 14A and the second magnetic sensor 14B and the distance therebetween that are measured by the measuring circuit 15, and measures the inflowing magnetic field gradient. The distance between the first magnetic sensor 14A and the second magnetic sensor 14B is not always measured by the measuring circuit 15. For example, a user may previously measure the distance, and input the distance to the long-term memory circuit 22 via the input unit 24 of the control circuit 17.

The inflowing magnetic field gradient in this case is not necessarily limited to the first-order, linear gradient. That is, the invention can be applied also to a state where the magnetic field gradient has substantially a first-order or higher-order gradient component, for example, the second-order gradient.

The processing advances to Step S20 "Threshold value determination of inflowing magnetic field gradient".

Threshold Value Determination of Inflowing Magnetic Field Gradient (S20)

The control circuit 17 determines whether or not the inflowing magnetic field gradient measured in Step S10 is equal to or less than a predetermined threshold value. The predetermined threshold value as used herein is obtained from a relation between the inflowing magnetic field gradient obtained in Step S10 and a magnetic field gradient permitted in the correction target space 150 (that is, an area where a brain magnetic field or the like is measured).

In the passive shield 11 in general, a magnetic field distribution of a ferromagnetic substance constituting the passive shield 11 is different between the vicinity of the opening 11A (11B) and the correction target space 150 due to the structure of the passive shield 11. Accordingly, the inflowing magnetic field gradient obtained in Step S10 is not uniformly present up to the correction target space 150, and it has also been known that the magnetic field gradient generally becomes gentle as the position approaches the correction target space 150 from the opening 11A (11B).

Then, as described above, the experiments by the present inventor have confirmed that the magnetic field gradient in the correction target space 150 can be estimated from the inflowing magnetic field gradient. That is, it has been confirmed that by making the inflowing magnetic field gradient equal to or less than a certain threshold value, the magnetic field gradient in the correction target space 150 can also be made equal to or less than a predetermined threshold value.

Specifically, it has been experimentally confirmed that the magnetic field gradient of the correction target space 150 can be estimated using, as parameters, the magnetic field strengths at the first magnetic sensor 14A and the second magnetic sensor 14B and the distance therebetween, that is, using the inflowing magnetic field gradient measured in Step S10 as a parameter. That is, by way of example, it has been confirmed that when the projected cross-section of the opening 11A has the area S, if the inflowing magnetic field gradient is about 50 nT/cm, the magnetic field gradient of the correction target space 150 located in a range from the origin to 1 to 1.6 times the square root of the area of the projected cross-section (in the case of the embodiment, a range from the origin to about 90 cm to 140 cm because S=8100 cm$^2$) is equal to or less than 2 nT/cm.

That is, by previously acquiring through experiments a certain inflowing magnetic field gradient and a magnetic field gradient in the correction target space 150 at the inflowing magnetic field gradient, a correlation between the inflowing magnetic field gradient and the magnetic field gradient in the correction target space 150 can be obtained. That is, by storing this correlated data or a relational formula derived from the data in, for example, the long-term memory circuit 22 of the control circuit 17, the determination in Step S20 can be easily performed.

The threshold value of the magnetic field gradient permitted in the correction target space 150 is determined according to the measurement range of a magnetic measuring device (highly sensitive magnetic sensor) such as a magnetocardiograph used in the correction target space 150.

More specifically, the threshold value is determined so that a difference between magnetic field strengths at both ends (both ends can be defined by the internal coil 13A and the internal coil 13B) of the correction target space 150 in the X-direction is equal to or less than a predetermined value according to the measurement range of the magnetic measuring device. For example, if the measurement range in the magnetic measuring device is assumed to be 10 nT, the threshold value of the magnetic field gradient permitted in the correction target space 150 is determined so that the difference between the magnetic field strengths at both ends of the correction target space 150 in the X-direction (the product of the magnetic field gradient of the correction target space 150 and the length of the correction target space 150 in the X-direction) is equal to or less than this measurement range.

That is, when the measurement range in the magnetic measuring device is 10 nT and the length between both ends of the correction target space 150 in the X-direction is 1 m, the threshold value of the magnetic field gradient in the correction target space 150 is 10 nT/m. The correction target space 150 where the magnetic field gradient is equal to or less than the magnetic field gradient permitted in the correction target space 150 is hereinafter referred to as the correction target space 150 where the magnetic field gradient is canceled.

That is, to make the inflowing magnetic field gradient equal to or less than the threshold value has the same meaning as to make the correction target space 150 into the magnetic field gradient-canceled space.

If the control circuit 17 determines that the inflowing magnetic field gradient is equal to or less than the threshold value obtained by the method described above, the control circuit 17 advances the processing to Step S30 "External coil maintaining state". If determining that the inflowing magnetic field gradient is greater than the threshold value, the control circuit 17 advances the processing to Step S40 "External coil controlling state".

External Coil Maintaining State (S30)

If the control circuit 17 determines that the inflowing magnetic field gradient is equal to or less than the threshold value, the control circuit 17 causes the driver circuit 16 to maintain the amount of current flowing into the external coils 12A and 12B for maintaining the present inflowing magnetic field gradient. Subsequently, the processing advances to Step S50 "Magnetic field measurement of correction target space".

External Coil Controlling State (S40)

If the control circuit 17 determines that the inflowing magnetic field gradient is greater than the threshold value, the control circuit 17 adjusts the amount of current flowing into the external coils 12A and 12B so that the magnetic field gradient is equal to or less than the threshold value. Specifically, the control circuit 17 outputs a signal to the driver circuit 16 for causing the driver circuit 16 to supply a current that produces a predetermined inflowing magnetic field gradient to the external coils 12A and 12B. The driver circuit 16 supplies the current to the external coils 12A and 12B based on the signal from the control circuit 17. A relation between the magnitude of the current to be supplied to the external coils 12A and 12B and a magnetic field generated inside the external coils 12A and 12B is previously stored in, for example, the long-term memory circuit 22 of the control circuit 17.

The method to make the inflowing magnetic field gradient equal to or less than the threshold value used in this control may be any method. For example, the control circuit 17 can control the amount of current to be supplied to the external coils 12A and 12B in any direction of the magnetic field gradient such as the case where the magnetic field strength measured by the second magnetic sensor 14B is greater than the magnetic field strength measured by the first magnetic sensor 14A, or, conversely, the case where the magnetic field strength measured by the second magnetic sensor 14B is less than the magnetic field strength measured by the first magnetic sensor 14A.

Then, the processing returns again to Step S10 "Inflowing magnetic field gradient measurement". Until the control circuit 17 determines that the magnetic field gradient is equal to or less than the threshold value, the control circuit 17 executes the loop of Step S10, Step S20, and Step S30.

If the control circuit 17 determines that the magnetic field gradient is equal to or less than the threshold value, the processing advances to Step S50 "Magnetic field measurement of correction target space".

Magnetic Field Measurement of Correction Target Space (S50)

Subsequently, the measuring circuit 15 performs the magnetic field measurement of the correction target space 150 with a highly sensitive sensor (for example, an optical pumping magnetic sensor) (not shown) arranged in the correction target space 150.

The reason is as follows. Through the steps up to Step S30, the correction target space 150 is already the magnetic field gradient-canceled space. However, since a residual magnetic field due to the passive shield 11 is generated also in the correction target space 150, there is a risk that the magnetic field strength of the correction target space 150 may be increased by the amount corresponding to at least the residual magnetic field strength. It should be noted that the magnetic field gradient-canceled state does not mean that the magnetic field strength is substantially zero. The magnetic field gradient-canceled state means that the magnetic field strength is uniform.

The processing advances to Step S60.

Threshold Value Determination of Magnetic Field Strength (S60)

The control circuit 17 acquires the magnetic field strength of the correction target space 150 from the measuring circuit 15 to determine whether or not the magnetic field strength of the correction target space 150 is equal to or less than a threshold value. As described above, the correction target space 150 is not in the state where the magnetic field strength is substantially zero. That is, because of the presence of the residual magnetic field, the correction target space 150 is in a state where an offset by the amount corresponding to the magnetic field strength of the residual magnetic field is applied, and this offset state serves as a background when performing the magnetic field measurement, making it impossible in some cases to provide a preferred magnetic field measurement environment according to an object to be measured.

The threshold value that serves as a criterion to determine whether the magnetic field strength is equal to or less than the threshold value in this case varies depending on the sensitivity of a magnetic field measuring device to be selected according to an object to be measured. However, the threshold value means such a value that can cancel the residual magnetic field remaining at least in the correction target space 150 to make the magnetic field strength substantially zero. By making the magnetic field strength substantially zero, the preferred magnetic field measurement environment can be provided.

The "substantially zero" is used in this case, because a measurement error is included, and it is impossible to say that the magnetic field strength is absolutely zero because the absolute sensitivity of a magnetic field measuring device required by an object to be measured varies.

If determining that the magnetic field strength of the correction target space 150 is equal to or less than the threshold value, the control circuit 17 advances the processing to Step S70 "Internal coil maintaining state". If determining that the magnetic field strength is greater than the threshold value, the control circuit 17 advances the processing to Step S80 "Internal coil controlling state".

Internal Coil Maintaining State (S70)

If the control circuit 17 determines that the magnetic field strength of the correction target space 150 is equal to or less than the threshold value, the control circuit 17 causes the driver circuit 16 to maintain the amount of current flowing into the internal coils 13A and 13B for maintaining the present magnetic field strength. Then, the operation of the magnetic shielding apparatus 100 ends. Since the inflowing magnetic field gradient or the magnetic field strength of the correction target space 150 varies in some cases due to the state of the exterior space, the processing may advance from Step S70 to again Step S10 "Inflowing magnetic field gradient measurement", and the loop of Step S10 to Step S80 of the processing flow may be executed.

Internal Coil Controlling State (S80)

If the control circuit 17 determines that the magnetic field strength of the correction target space 150 is greater than the predetermined threshold value, the control circuit 17 adjusts the amount of current flowing into the internal coils 13A and 13B so that the magnetic field strength is equal to or less than the threshold value. Specifically, the control circuit 17 outputs a signal to the driver circuit 16 for causing the driver circuit 16 to supply a current that produces a predetermined magnetic field strength to the internal coils 13A and 13B.

The driver circuit 16 supplies the current to the internal coils 13A and 13B based on the signal from the control circuit 17. A relation between the magnitude of the current to be supplied to the internal coils 13A and 13B and the magnetic field generated inside the internal coils 13A and 13B is previously stored in, for example, the long-term memory circuit 22 of the control circuit 17.

Then, the processing advances to Step S50 "Magnetic field measurement of correction target space", and until the control circuit 17 determines that the magnetic field strength is equal to or less than the threshold value, the loop of Step S50, Step S60, and Step S80 is executed.

If the control circuit 17 determines that the magnetic field strength is equal to or less than the threshold value, the processing advances to Step S70 "Internal coil maintaining state", and the operation of the magnetic shielding apparatus 100 ends.

Figure 5A:
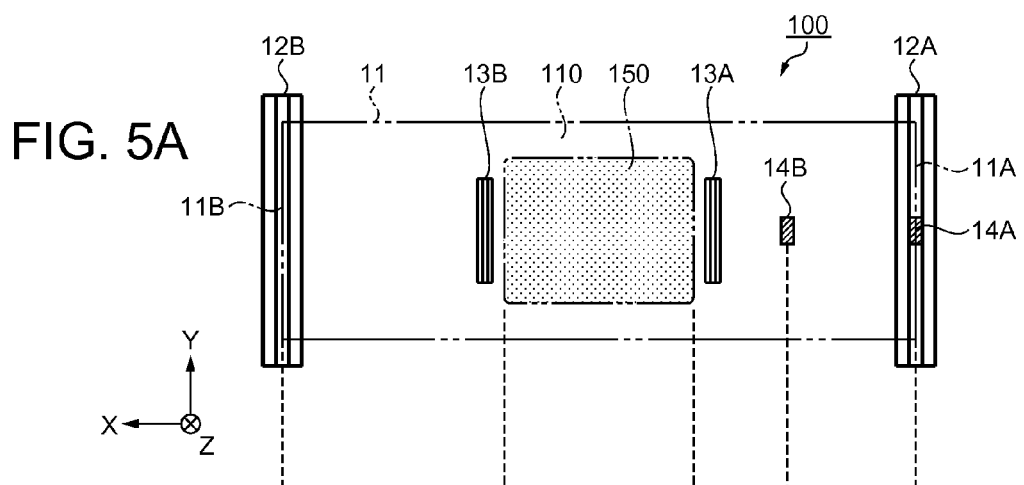
FIGS. 5A and 5B are distribution charts of the magnetic field strength of the magnetic shielding apparatus.
Figure 5B:
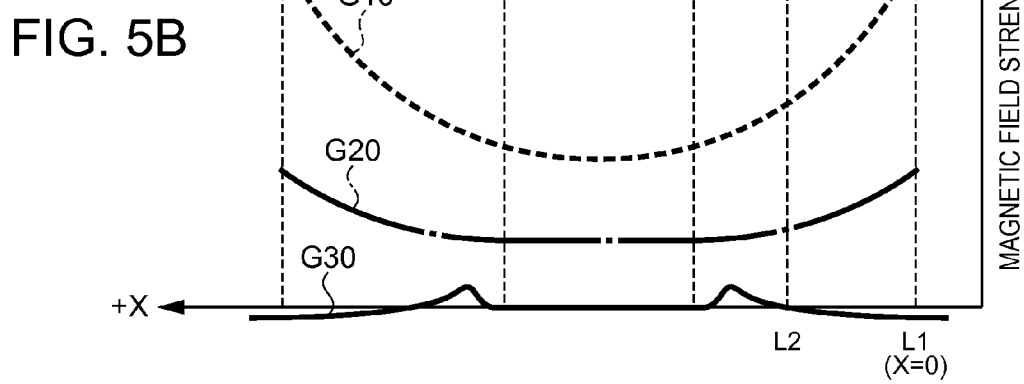

A relation between the magnetic field gradient and the magnetic field strength controlled according to the processing flow in FIG. 4 will be further described using FIGS. 5A and 5B. FIGS. 5A and 5B show an example of a distribution of the magnetic field strength of the magnetic shielding apparatus 100 controlled according to the processing flow in FIG. 4. A description overlapping the preceding drawings is omitted.

FIG. 5A is an overview of the magnetic shielding apparatus 100, similar to that of FIG. 2. FIG. 5B is a distribution chart of the magnetic field strength corresponding to the X-direction in FIG. 5A. In FIG. 5B, the vertical axis represents the magnetic field strength, while the horizontal axis represents a relative positional relation with the opening 11A as the origin in the X-direction and with a direction from the first magnetic sensor 14A toward the second magnetic sensor 14B as the positive X-direction. For the sake of convenience, the position of the first magnetic sensor 14A in the X-direction is L1 (X=0 because the position is actually the origin), while the position of the second magnetic sensor 14B is L2. It is sufficient that L1 and L2 are within the ranges expressed by Formula (1) and Formula (2) described above. Each of intersections of vertical dashed lines downward from the members in FIG. 5A toward FIG. 5B and respective lines in FIG. 5B represents an approximate magnetic field strength at the member.

A dashed line G10 in FIG. 5B shows an example of an approximate magnetic field strength distribution in an initial state, that is, before starting the driving of the magnetic shielding apparatus 100 in FIG. 4. A magnetic field gradient (so-called inflowing magnetic field gradient) between L1 and L2 is greater than the threshold value determined in Step S20 in FIG. 4, so that the magnetic field gradient in the correction target space 150 is not in the canceled state. Moreover, the magnetic field strength of the correction target space 150 is also greater than the threshold value determined in Step S60 in FIG. 4.

A dashed-dotted line G20 in FIG. 5B shows an approximate magnetic field strength distribution in Step S30 "External coil maintaining state" in FIG. 4. That is, it shows a state where the processes in Step S10 and Step S20 (including Step S40) are finished. A magnetic field gradient between L1 and L2 is equal to or less than the threshold value determined in Step S20 in FIG. 4, so that the correction target space 150 is in the so-called magnetic field gradient-canceled state. However, the magnetic field strength of the correction target space 150 is greater than the threshold value determined in Step S60.

A solid line G30 in FIG. 5B shows an approximate magnetic field strength distribution in Step S70 "Internal coil maintaining state" in FIG. 4. That is, it shows a state where the processes in Step S50 and Step S60 (including Step S80) are further finished from the dashed-dotted line G20. The magnetic field strength of the correction target space 150 is equal to or less than the threshold value determined in Step S60 in FIG. 4, so that it shows a state where the preferred magnetic field measurement environment is formed.

On the solid line G30, convex displacements in magnetic field strength are shown at both ends of the correction target space 150, that is, around the internal coils 13A and 13B. These are generated magnetic fields generated when driving the internal coils 13A and 13B using the Helmholtz coil, but do not affect the distribution of the magnetic field strength of the correction target space 150.

According to the magnetic shielding apparatus 100 according to the embodiment described above, the following advantageous effects are obtained. (1) By controlling the inflowing magnetic field gradient, the so-called magnetic field gradient-canceled space can be formed in the correction target space 150. Accordingly, the correction target space 150 can be made into the preferred magnetic field measurement environment.

(2) For making the magnetic field strength of the correction target space 150 equal to or less than the threshold value, the magnetic field strength can be controlled using the publicly known Helmholtz coil as the internal coils 13A and 13B. That is, with the internal coils 13A and 13B that are easily available, the correction target space 150 can be made into a substantially zero magnetic field, so that minute magnetic signals from, for example, the heart or brain can be measured at a high SN ratio.

(3) It is sufficient that the first magnetic sensor 14A and the second magnetic sensor 14B have the measurement sensitivity at about the same level. They do not need to be, for example, a highly sensitive sensor (for example, an optical pumping magnetic sensor) (not shown) arranged in the correction target space 150. Accordingly, the magnetic shielding apparatus 100 with reduced manufacturing cost can be provided.

The invention is not limited to the embodiment described above, and various embodiments are possible. Some modified examples will be described below. A description of portions overlapping the portions described in the embodiment is omitted.

MODIFIED EXAMPLE 1

Arrangement Examples of Magnetic Sensors

The arrangement of the first magnetic sensor 14A and the like for measuring a magnetic field strength is not limited to that shown in FIG. 2. Some arrangements of the first magnetic sensor 14A and the like will be described below.

Figure 6:
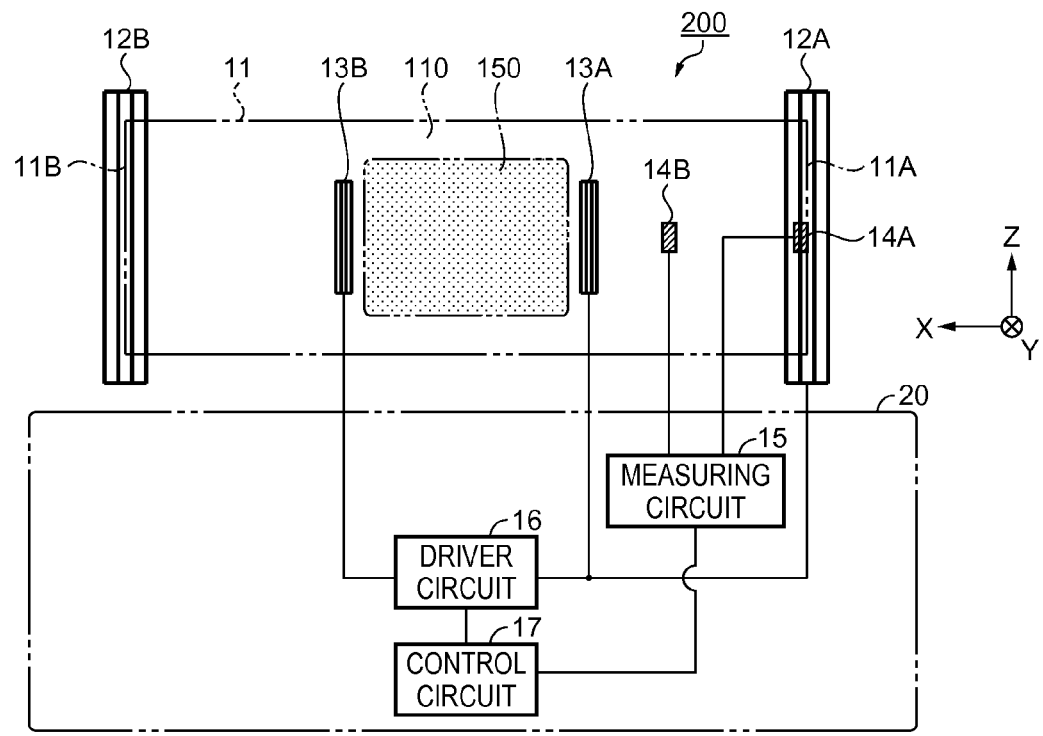
FIG. 6 is an overview of the magnetic shielding apparatus, showing a second arrangement example.

FIG. 6 is an overview of a magnetic shielding apparatus 200, showing a second arrangement example. In this example, only one external coil 12A is driven, and the other external coil 12B is not driven. Therefore, the control of the inflowing magnetic field gradient performed by the control circuit 17 can be simplified.

Figure 7:
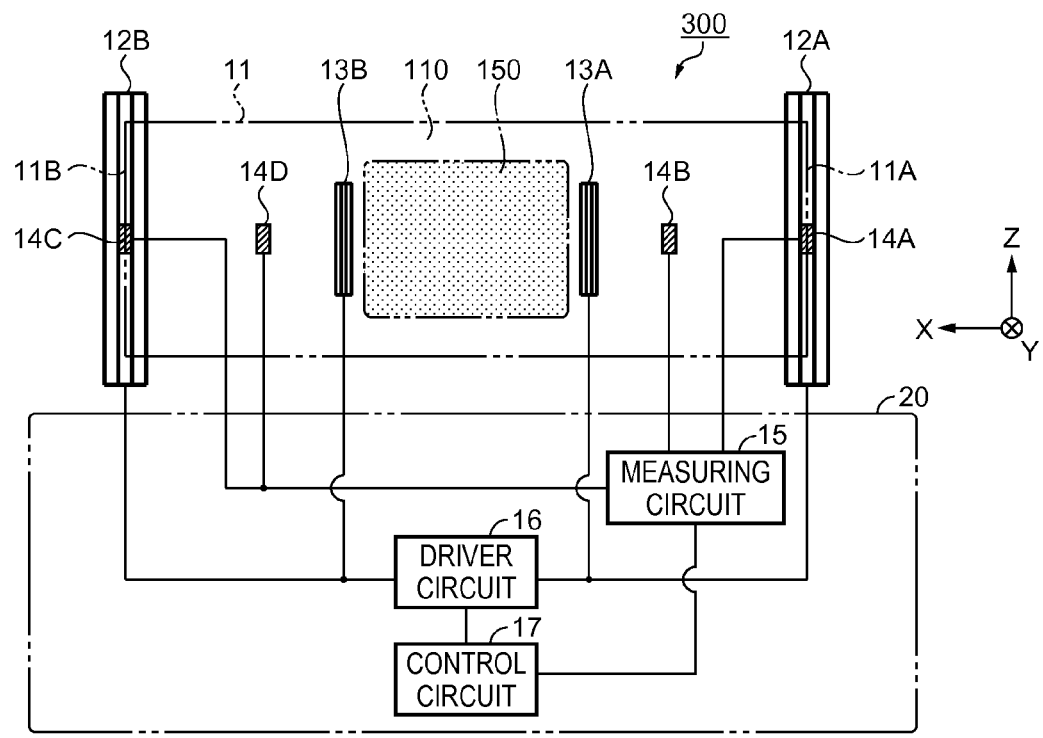
FIG. 7 is an overview of the magnetic shielding apparatus, showing a third arrangement example.

FIG. 7 is an overview of a magnetic shielding apparatus 300, showing a third arrangement example. In this example, two sets of magnetic sensors are provided: one set is for measuring the inflowing magnetic field into the passive shield 11 and the other set for measuring the magnetic field of the interior space 110. First magnetic sensors 14A and 14C are magnetic sensors for measuring the strength of the inflowing magnetic field from the exterior space into the interior space 110, while second magnetic sensors 14B and 14D are magnetic sensors for measuring the magnetic field strength of the interior space 110. In this example, the first magnetic sensors 14A and 14C and the second magnetic sensors 14B and 14D are arranged on the central axis 110A (not shown).

An inflowing magnetic field gradient on the opening 11A side as one end of the passive shield 11 is measured by the first magnetic sensor 14A and the second magnetic sensor 14B, while an inflowing magnetic field gradient on the opening 11B side at the other end is measured by the magnetic sensor 14C and the magnetic sensor 14D. Then, each of the inflowing magnetic field gradients is controlled by the control circuit 17 so as to be equal to or less than the threshold value.

According to the third arrangement example of the magnetic sensors, the inflowing magnetic field gradient can be controlled to be equal to or less than the threshold value as to the inflowing magnetic fields from the openings 11A and 11B located at both ends of the passive shield 11. Therefore, also in the passive shield 11 where there is no symmetry of the inflowing magnetic field, the inflowing magnetic field gradient can be easily controlled.

Figure 8:
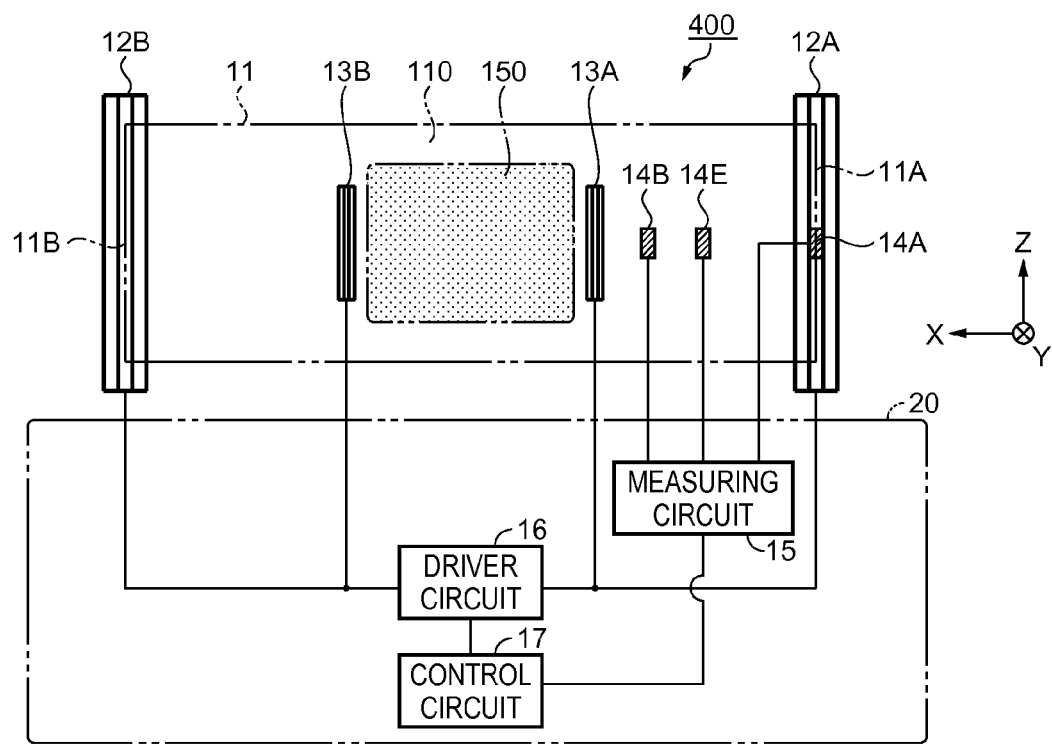
FIG. 8 is an overview of the magnetic shielding apparatus, showing a fourth arrangement example.

FIG. 8 is an overview of a magnetic shielding apparatus 400, showing a fourth arrangement example. Three magnetic sensors for measuring the magnetic field strength are arranged along the central axis 110A (not shown). From the opening 11A toward the interior of the passive shield 11, the first magnetic sensor 14A, a magnetic sensor 14E, and the second magnetic sensor 14B are arranged in this order. In this example, it is also possible to measure the inflowing magnetic field gradient with the second magnetic sensor 14B and the magnetic sensor 14E that are arranged in the interior space 110 without using the first magnetic sensor 14A that is closest to the opening 11A. On the other hand, it is also possible to measure magnetic field strengths with the three respective sensors, the first magnetic sensor 14A and the second magnetic sensors 14B and 14E, and measure the inflowing magnetic field gradient through a predetermined arithmetic operation (for example, a least-squares approximation method).

When measuring the inflowing magnetic field gradient, four or more magnetic sensors may be used to measure a more detailed magnetic field gradient. An arrangement direction of the second magnetic sensor 14B and the magnetic sensor 14E that are arranged in the interior space 110 may not be along the direction of the central axis 110A (not shown). This is because, depending on the structure of the passive shield 11 for example, the measurement sensitivity of the second magnetic sensors 14B and 14E to the magnetic field gradient is also changed in some cases according to the arrangement direction thereof.

Figure 9:
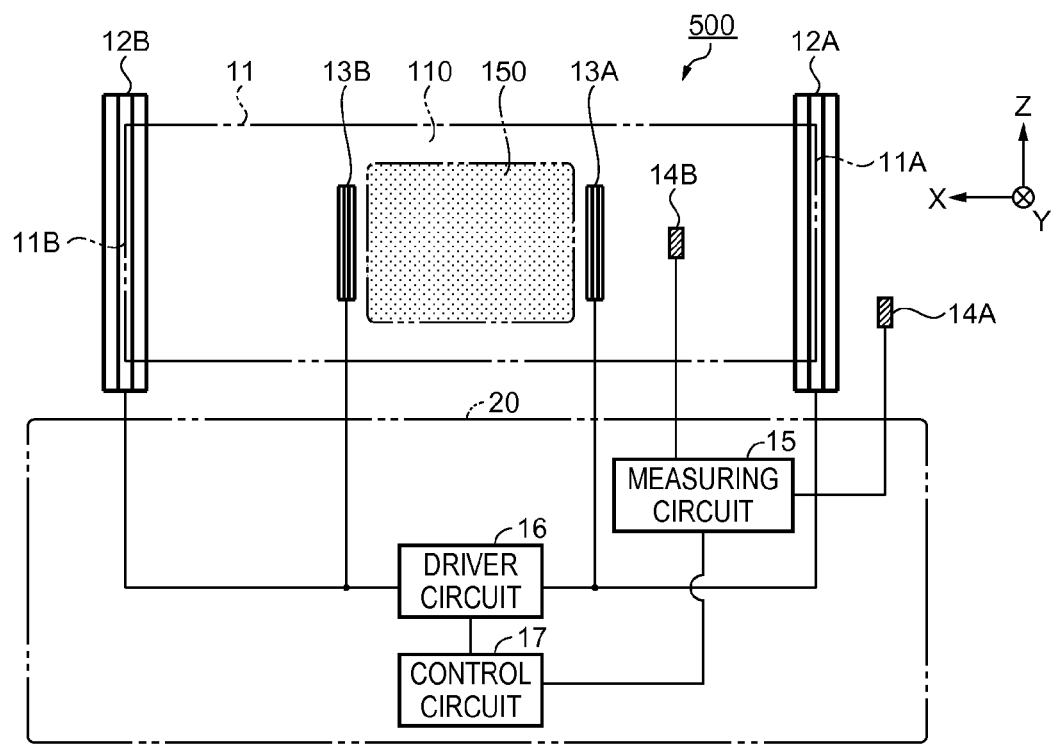
FIG. 9 is an overview of the magnetic shielding apparatus, showing a fifth arrangement example.

FIG. 9 is an overview of a magnetic shielding apparatus 500, showing a fifth arrangement example. It is sufficient that the magnetic sensors for measuring the strength of the inflowing magnetic field are present in the above-described range (Formula (1)) where the first magnetic sensor 14A can be arranged, and the arrangement direction of the first magnetic sensor 14A and the second magnetic sensor 14B does not need to be along the central axis 110A (not shown). This is because it is sufficient that the first magnetic sensor 14A can measure the inflowing magnetic field from the exterior space into the interior space 110.

MODIFIED EXAMPLE 2

The cross-sectional shape of the passive shield 11 in the X-direction is not limited to that described in the embodiment. For example, the cross-sectional shape may be polygonal or circular, or may be a shape combining a straight line with a curve at the periphery. Specifically, the cross-sectional shape of the passive shield 11 may be a circle or an ellipse, and in addition, may be a quadrilateral shape, a pentagonal shape, a hexagonal shape, a heptagonal shape, an octagonal shape, and the like in the case of a polygon.

Moreover, the passive shield 11 may not include the openings 11A and 11B, or may include only one of the openings 11A and 11B. Alternatively, the openings 11A and 11B are covered with lids or the like. By providing flexibility in the shape of the passive shield 11, the magnetic shielding apparatus 100 can be applied to various magnetic measuring devices.

MODIFIED EXAMPLE 3

The internal coils 13A and 13B may be omitted. This is because even when the magnetic shielding apparatus 100 does not include the internal coils 13A and 13B, the correction target space 150 where the magnetic field gradient is canceled can be formed by controlling the inflowing magnetic field gradient using the external coils 12A and 12B. When the internal coils 13A and 13B are not included, the area where, for example, a highly sensitive magnetic sensor is arranged is the correction target space 150.

MODIFIED EXAMPLE 4

In the embodiment described above, an example of correcting the magnetic field in the X-direction (that is, one axis) has been described. In the interior space 110, on the other hand, the inflowing magnetic field gradient may be corrected by measuring the magnetic field strength in two axes or more. In this case, the magnetic shielding apparatus 100 includes two sets or more of external coils. Specifically, in the case of three axes for example, two external coils for each of three axes, the X-, Y-, and Z-axes, (six in total) may be used to measure a magnetic field having components in the three axial directions in the magnetic shielding apparatus 100. Compared to the case of measuring the inflowing magnetic field gradient of only one axis, the measurement of the inflowing magnetic field gradient can be performed with high accuracy.

MODIFIED EXAMPLE 5

The passive shield 11 is not limited to the case where the passive shield 11 is arranged so that the central axis 110A thereof is substantially horizontal. For example, the passive shield 11 may be arranged like a phone booth so that the central axis 110A is substantially vertical.

MODIFIED EXAMPLE 6

The external coils 12A and 12B are the Helmholtz coil by way of example, but another configuration can be employed. For example, a plurality of external coils may be arranged at an equal interval between the external coil 12A and the external coil 12B.

What is claimed is:

1. A magnetic shielding apparatus comprising:
    a passive shield housing extending in a first direction;
    a correction target space that is defined in an inner space of the passive shield housing, the correction target space including a center of the passive shield housing;
    a first coil that corrects a magnetic field in the inner space in the passive shield housing, the first coil being provided at a first edge of the passive shield housing in the first direction;
    a first magnetic sensor that is provided at the first edge of the passive shield housing in the first direction and that measures a first magnetic field so as to output a first value corresponding to the first magnetic field;
    a second magnetic sensor that is arranged in the inner space of the passive shield housing so that the second magnetic sensor is closer to the center of the passive shield housing than the first magnetic sensor, the second magnetic sensor measuring a second magnetic field so as to output a second value corresponding to the second magnetic field;
    a driving circuit that applies a first current to the first coil; and
    a controller that is configured to calculate a magnetic field gradient between the first and second magnetic sensors based on the first and second values and a distance between the first and second magnetic sensors in the first direction, wherein
    the controller controls the first current based on the magnetic field gradient.

2. The magnetic shielding apparatus according to claim 1, wherein
    the controller controls the first current so that the magnetic field gradient is equal to or less than a predetermined value.

3. The magnetic shielding apparatus according to claim 1, wherein
    the controller calculates the magnetic field gradient along the first direction, and
    an axis of the first coil is along the first direction.

4. The magnetic shielding apparatus according to claim 1, wherein
    the passive shield housing includes an opening at the first edge, and
    the first magnetic sensor is located at a first position, and a first distance between a center of the opening and the first position is in a range from −0.5 times to 1.0 times the square root of an area of the opening.

5. The magnetic shielding apparatus according to claim 1, wherein
    the passive shield housing includes an opening at the first edge, and
    the second magnetic sensor is located at a second position, and a second distance between a center of the opening and the second position is in a range from 0 times to 1.0 times the square root of an area of the opening.

6. The magnetic shielding apparatus according to claim 1, wherein
the correction target space is located closer to the center of the passive shield housing than the first magnetic sensor in the first direction.

7. The magnetic shielding apparatus according to claim 1, further comprising:
a second coil that adjusts a magnetic field strength of the correction target space,
wherein the second coil is located in the inner space of the passive shield housing.

8. A method for controlling a magnetic shielding device, the magnetic shielding device including:
a passive shield housing extending in a first direction;
a correction target space that is defined in an inner space of the passive shield housing, the correction target space including a center of the passive shield housing;
a first coil that corrects a magnetic field in the inner space in the passive shield housing, the first coil being provided at a first edge of the passive shield housing in the first direction;
a first magnetic sensor that is provided at the first edge of the passive shield housing in the first direction and that measures a first magnetic field so as to output a first value corresponding to the first magnetic field; and
a second magnetic sensor that is arranged in the inner space of the passive shield housing so that the second magnetic sensor is closer to the center of the passive shield housing that the first magnetic sensor, the second magnetic sensor measuring a second magnetic field so as to output a second value corresponding to the second magnetic field, the method comprising:
calculate a magnetic field gradient between the first and second magnetic sensors based on the first and second values and a distance between the first and second magnetic sensors in the first direction;
controlling a first current, which is applied to the first coil, so that the magnetic field gradient is equal to or less than a first predetermined value;
measuring a magnetic field strength in the correction target space; and
controlling the magnetic field strength so that the magnetic field strength is equal to or less than a second predetermined value.

* * * * *